US009746786B2

(12) United States Patent
Lin et al.

(10) Patent No.: US 9,746,786 B2
(45) Date of Patent: Aug. 29, 2017

(54) OVERLAY MASK

(71) Applicant: UNITED MICROELECTRONICS CORP., Hsin-Chu (TW)

(72) Inventors: Che-Yi Lin, Kaohsiung (TW); En-Chiuan Liou, Tainan (TW); Yi-Jing Wang, Tainan (TW); Chia-Hsun Tseng, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/260,322

(22) Filed: Sep. 9, 2016

(65) Prior Publication Data

US 2017/0115579 A1    Apr. 27, 2017

Related U.S. Application Data

(62) Division of application No. 14/920,859, filed on Oct. 22, 2015, now Pat. No. 9,470,987.

(51) Int. Cl.
*G03F 7/00* (2006.01)
*G03F 7/20* (2006.01)

(52) U.S. Cl.
CPC ................................ *G03F 7/70633* (2013.01)

(58) Field of Classification Search
CPC .................................................. G03F 7/70633
See application file for complete search history.

(56) References Cited

U.S. PATENT DOCUMENTS

| | | | |
|---|---|---|---|
| 4,758,863 A | 7/1988 | Nikkel | |
| 5,995,200 A | 11/1999 | Pierrat | |
| 7,065,737 B2 | 6/2006 | Phan et al. | |
| 7,667,842 B2 | 2/2010 | Schulz | |
| 7,933,015 B2 | 4/2011 | Chiu | |
| 7,998,826 B2* | 8/2011 | Yang | G03F 7/70633 257/797 |
| 8,084,872 B2 | 12/2011 | Yang | |
| 8,183,123 B2* | 5/2012 | Yang | G03F 7/70633 257/797 |
| 8,183,701 B2* | 5/2012 | Shih | G03F 7/70625 257/797 |
| 8,564,143 B2 | 10/2013 | Chen et al. | |
| 8,565,531 B2 | 10/2013 | Malik | |
| 9,230,867 B2 | 1/2016 | Cheng | |
| 2001/0055720 A1 | 12/2001 | Sato | |
| 2002/0093110 A1* | 7/2002 | Fujimoto | G03F 9/7076 257/797 |
| 2005/0122516 A1 | 6/2005 | Sezginer | |
| 2008/0085581 A1* | 4/2008 | Kim | H01L 21/0337 438/241 |
| 2010/0002933 A1* | 1/2010 | Yang | G03F 7/70633 382/151 |
| 2010/0187611 A1 | 7/2010 | Schiwon | |

(Continued)

*Primary Examiner* — Ida M Soward
(74) *Attorney, Agent, or Firm* — Winston Hsu

(57) ABSTRACT

An overlay mask includes a plurality of first patterns, a plurality of second patterns and a plurality of third patterns. The first patterns are arranged within a first pitch. The second patterns are arranged within a second pitch. A first portion of the third patterns are arranged alternately with the first patterns, within the first pitch, and a second portion of the third patterns are arranged alternately with the second patterns, within the second pitch, and the first pitch is not equal to the second pitch.

11 Claims, 8 Drawing Sheets

(56) References Cited

U.S. PATENT DOCUMENTS

| | | | |
|---|---|---|---|
| 2010/0315094 A1* | 12/2010 | Yoo | G03F 7/70633 324/537 |
| 2010/0321705 A1* | 12/2010 | Miyasaka | G03F 9/7076 356/620 |
| 2013/0148120 A1* | 6/2013 | Okamoto | G03F 7/70633 356/401 |
| 2013/0200535 A1* | 8/2013 | Chen | G03F 7/70633 257/797 |
| 2013/0252428 A1 | 9/2013 | Cheng | |
| 2015/0055125 A1* | 2/2015 | Tzai | G03F 7/70633 356/72 |
| 2015/0155261 A1 | 6/2015 | Uhm | |
| 2015/0187703 A1* | 7/2015 | Zhou | H01L 23/544 257/797 |
| 2015/0263169 A1 | 9/2015 | Gu | |
| 2016/0035617 A1 | 2/2016 | Kim | |
| 2016/0093573 A1* | 3/2016 | Liou | G03F 7/70633 257/741 |
| 2016/0179017 A1 | 6/2016 | Yohanan | |

\* cited by examiner

OVERLAY MASK

CROSS REFERENCE TO RELATED APPLICATIONS

This application is a Divisional of application Ser. No. 14/920,859 filed Oct. 22, 2015, and included herein by reference.

BACKGROUND OF THE INVENTION

1. Field of the Invention

The present invention relates to an integrated circuit (IC), and more particularly to an overlay mark used for alignment accuracy measurement in an IC.

2. Description of the Prior Art

As the linewidth of the IC process continuously gets narrower, the alignment accuracy between a lower layer and an upper layer becomes more and more important. Therefore, an overlay mark is generally formed on a wafer to check alignment accuracy.

A conventional overlay mark typically includes x-directional linear patterns and y-directional linear patterns of a single pre-layer, and x-directional linear patterns and y-directional linear patterns of the current layer. Overlay errors have been measured only between two adjacent layers.

However, in ICs with multiple layers, displacement between non-adjacent layers may compromise IC performance. Therefore, improving the integrity of overlay marks between multiple pre-layers is still an important issue in the field.

SUMMARY OF THE INVENTION

It is one of the primary objectives of the present invention to provide an overlay mask, so as to improve diversity in mark design, and to further avoid signal missing or overlay issues.

To achieve the purpose described above, the present invention provides an overlay mask including a plurality of first patterns, a plurality of second patterns and a plurality of third patterns. The first patterns are arranged within a first pitch. The second patterns are arranged within a second pitch. A first portion of the third patterns are arranged alternately with the first patterns, within the first pitch, and a second portion of the third patterns are arranged alternately with the second patterns, within the second pitch, and the first pitch is not equal to the second pitch.

To achieve the purpose described above, the present invention provides an overlay mask including a plurality of regions arranged in an array, a plurality of first patterns, a plurality of second patterns and a plurality of third patterns. The regions at least include a first region and a second region arranged in parallel with each other. The first patterns are disposed in a first part of the first region and a second part of the second region. The second patterns are disposed in a second part of the first region and a first part of the second region. A portion of the third patterns are arranged alternately to the first patterns and the second patterns respectively in the first region, in a first direction, and another portion of the third patterns are arranged alternately to the first patterns and the second patterns respectively in the second region, in a second direction perpendicular to the first direction.

According above, the overlay mask of the present invention includes patterns defined on different layers through different exposure steps. Since the linear patterns defined by at least two layers are disposed together within the same pitch, the arrangement of the overlay mask may be more diverse, and the overlay measurement is more convenient so as to effectively save the overlay measurement time. Thus, the area utilization efficiency of the overlay mark is higher than the conventional overlay mark in the present invention.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 3 are schematic diagrams illustrating a method of forming an overlay mask according to a first preferred embodiment of the present invention; in which:

FIG. 1 shows an overlay mask at the beginning of the forming process;

FIG. 2 shows an overlay mask after forming patterns on three different layers;

FIG. 3 shows a semiconductor structures defined from the overlay mask shown in FIG. 2.

DETAILED DESCRIPTION

To provide a better understanding of the present invention, preferred embodiments will be described in detail. The preferred embodiments of the present invention are illustrated in the accompanying drawings with numbered elements.

Figure 1:
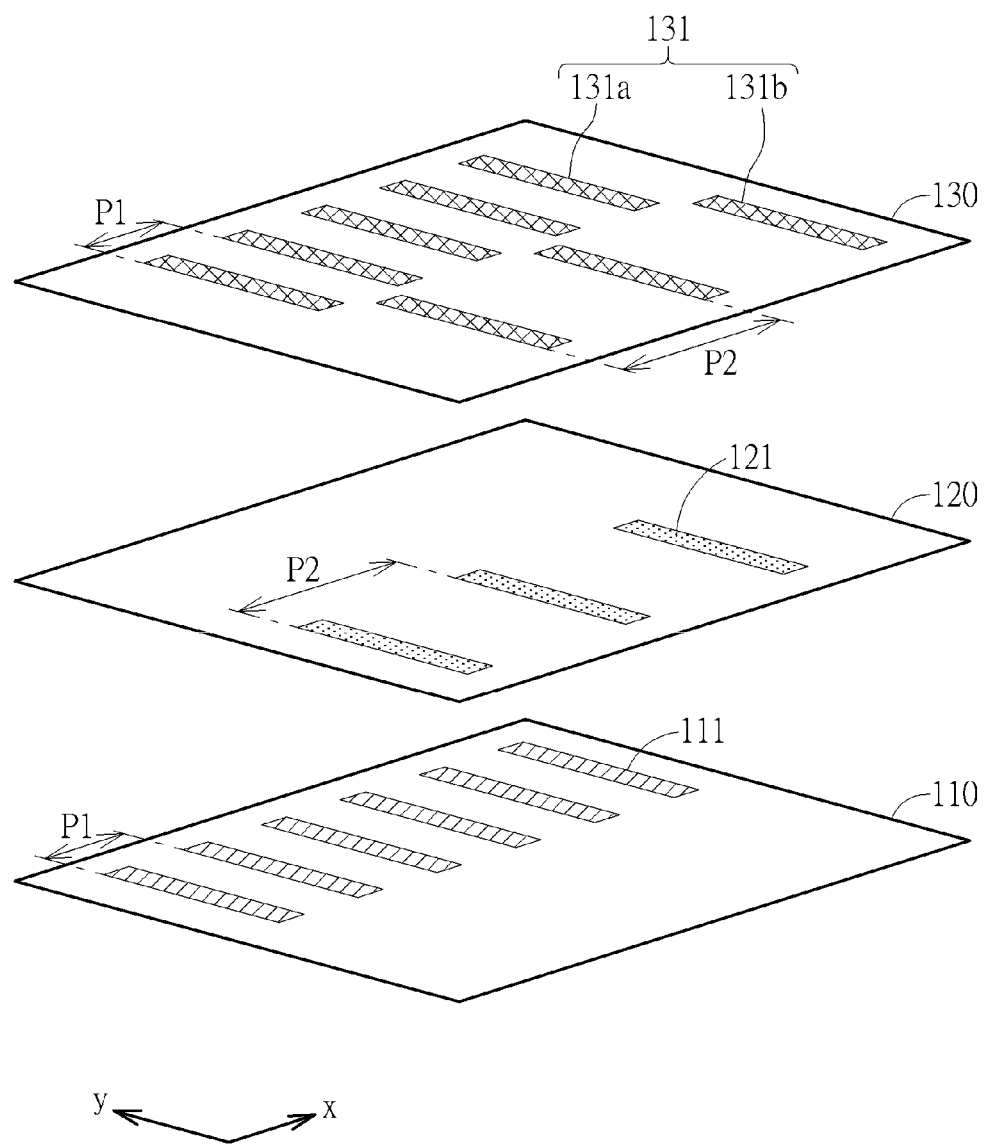
Figure 2:
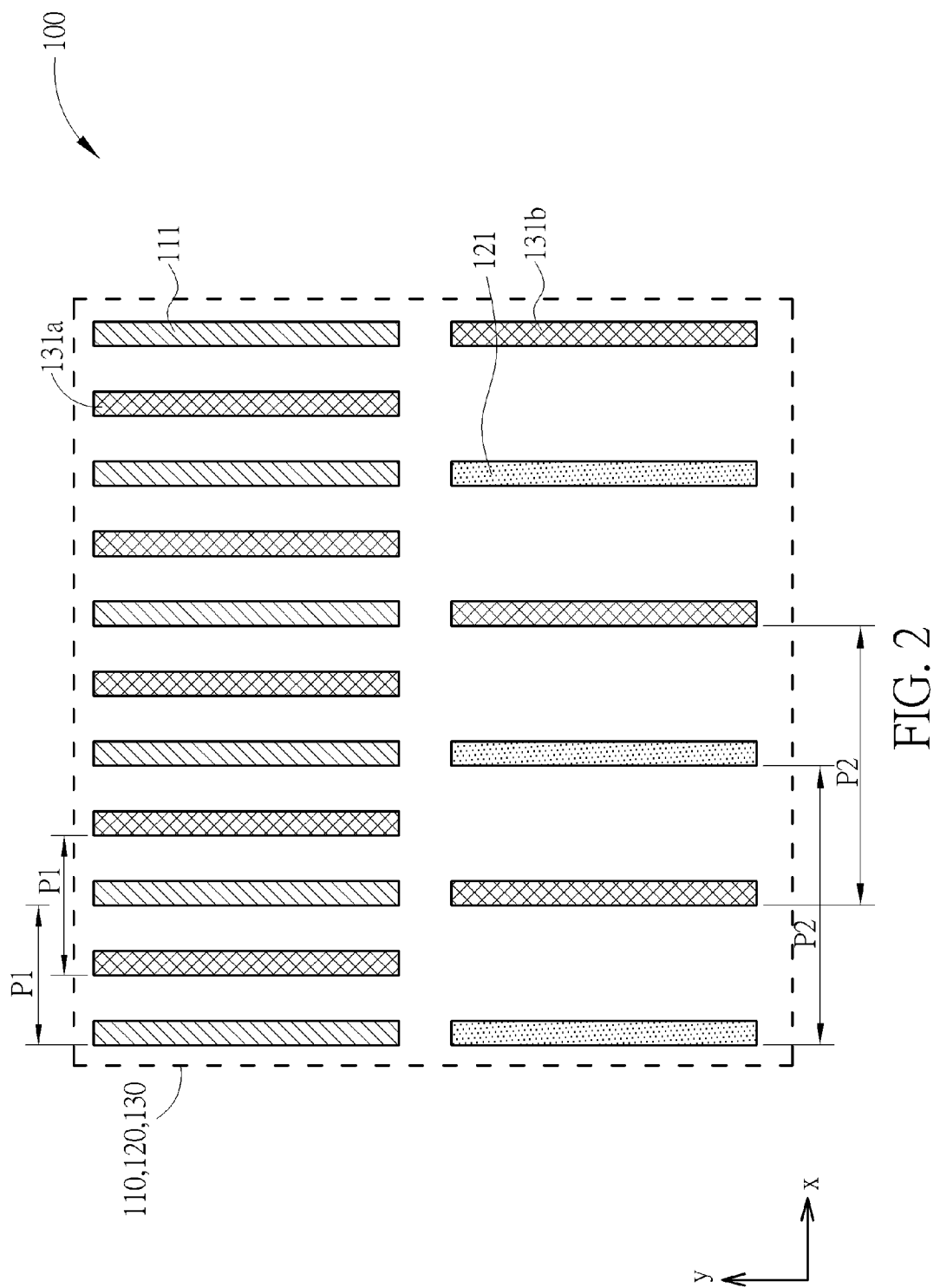
Figure 3:
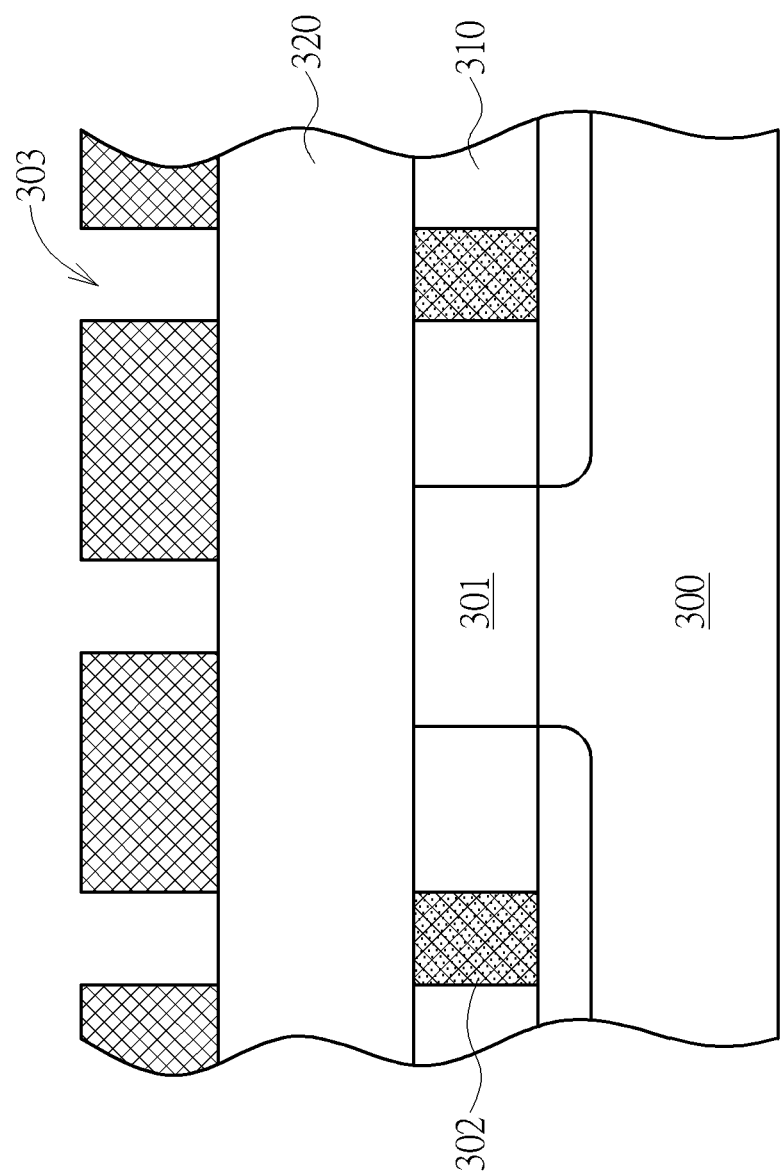

Referring to FIG. 1 to FIG. 3, which are schematic diagrams illustrating a method of forming an overlay mask according to the first preferred embodiment of the present invention, which may include sequentially forming a plurality of first patterns 111, second patterns 121 and third patterns 131 for example through three different exposure steps. In one embodiment, the first patterns 111, the second patterns 121 and the third patterns 131 may be respectively formed on three different layers 110, 120, 130, and relationships among the three different layers 110, 120, 130 are illustrated, for example being vertically and sequentially arranged, as shown in FIG. 1, but is not limited thereto. People skilled in the art shall easily realize that the first patterns 111, the second patterns 121 and the third patterns 131 of the present invention may be respectively formed by using a self-aligned double-patterning (SADP) process, also known as sidewall image transfer (SIT) technique, for obtaining required microminiature patterns, or by using other methods which are well known in the art and will not be redundantly described herein.

Precisely, the first patterns 111 parallelly arranged along a first direction, for example y-direction, are defined on the layer 110, wherein the first patterns 111 are arranged within a first pitch P1; and the second patterns 121 also parallelly arranged along the first direction, for example the y-direction, are defined on the layer 120, wherein the second patterns 121 are arranged within a second pitch P2. Please note that the first pitch P1 is not equal to the second pitch P2, as shown in FIG. 1. On the other hand, the third patterns 131 also parallelly arranged along the first direction, for example the y-direction, are defined on the layer 130. The third patterns 131 defined on the layer 130 include two portions, a first portion of the third patterns 131*a* are arranged within the first pitch P1 ad a second portion of the third patterns 131*b* are arranged within the second pitch P2, as shown in FIG. 1.

Figure 7:
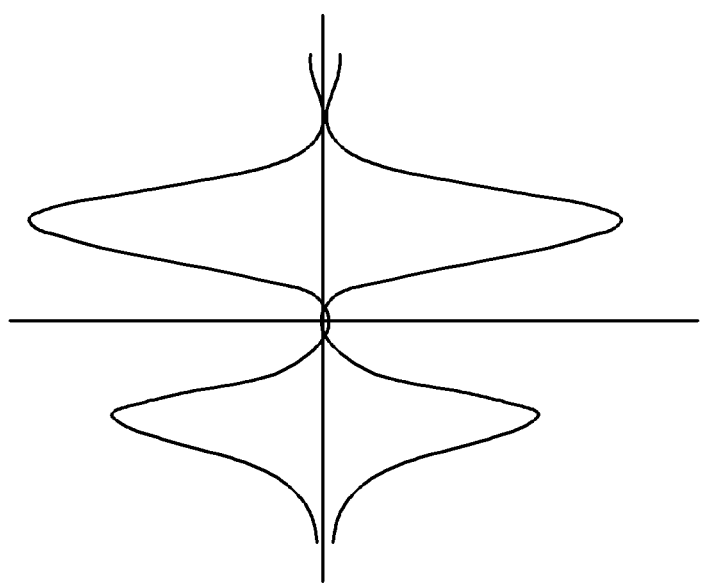
FIG. 7 to FIG. 8 are schematic diagrams illustrating predict butterfly plots of the overlay mask according to the present invention.
Figure 8:
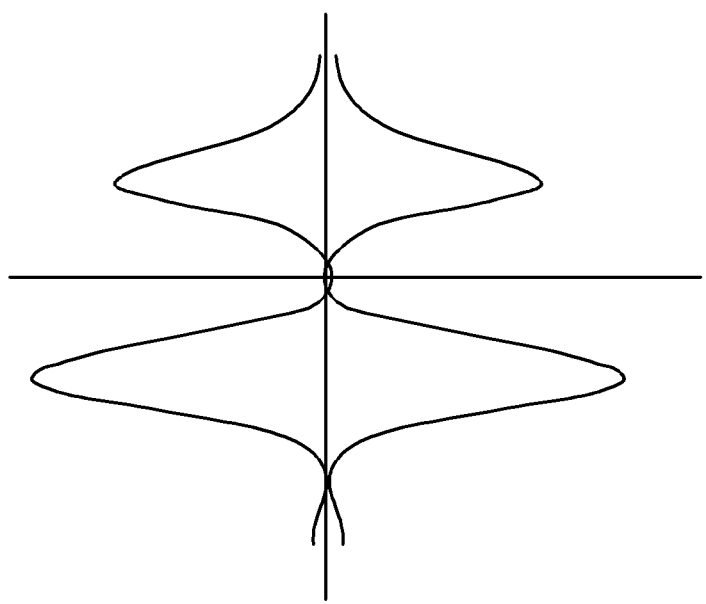

In this manner, an overlay mask 100 according to the first preferred embodiment of the present invention may be provided, and which includes the first patterns 111, the second patterns 121 and the third patterns 131 all parallelly arranged in the first direction, like the y-direction for example, as shown in FIG. 2. It is noted that, in one embodiment, the first portion of the third patterns 131*a* are alternately arranged with the first patterns 111 in the first pitch P1, and the second portion of the third patterns 131*b* are alternately arranged with the second patterns 121 in the second pitch P2. Please also note that, the first pitch P1 is not equal to the second pitch P2, for example, being smaller than the second pitch P2, as shown in FIG. 2, such that, a predicted butterfly plot shown in FIG. 7 may be obtained. However, the relationship between the two pitches P1, P2 is not limited thereto, and in another embodiment, the first pitch may also be greater than the second pitch (not shown in the drawings), and a predicted butterfly plot shown in FIG. 8 may be obtained accordingly.

Furthermore, the overlay mark 100 maybe used to derive overlay errors or alignment errors in the following manner. For example, the overlay errors or the alignment errors of the third exposure step of the layer 130 with respect to the layer 110 or the layer 120 may be taken through simultaneously calculating the pitches of the first patterns 111 and the first portion of the third patterns 131*a,* or the pitches of the second patterns 121 and the second portion of the third patterns 131*b,* and then comparing with each other, thereby avoiding patterns missing or overlapping. However, people skilled in the art shall easily realize that the method of deriving overlay errors or alignment errors in the present invention is not limited to the aforementioned step, and may further include other processes.

It is also noted that, the patterns 111, 121, 131 of the overlay mask 100 corresponding to such layers 110, 120, 130 may represent various circuit design features, and such circuit design features maybe remedied after-develop-inspection critical dimension (ADI CD) or after-etch-inspection critical dimension (AEI CD). For example, in one embodiment, layer 110 may represent a conductive line, like a polysilicon line 301 for example, in an active region on a die, and layers 120, 130 may represent a contact 302 formed in a dielectric layer 310 and a photoresist layer 303 having a plurality of via opening, respectively, also in the active region on the die, as shown in FIG. 3. On the other hand, the overlay defined by such three layers 110, 120, 130 may be obtained accordingly, for example on a scribe line of the die or other unnecessary area thereof, such that, the overlay errors or the alignment errors between the three exposure steps may be measured through calculating the pitches of the patterns defined by the three layers 110, 120, 130. Then, the overlay errors or the alignment errors occurring therein may be remedied via an ADI CD process, but is not limited thereto. In another embodiment, the layer 130 may also represent a via opening (not shown in the drawings) defined in a dielectric layer 320, so that, the overlay error of the third exposure step of the layer 130 may be remedied via an AEI CD process.

As indicated above, the overlay mask according to the first embodiment is obtained. Since the linear patterns defined by at least two layers are disposed together within the same pitch, the arrangement of the overlay mask may be more diverse, and the overlay measurement is more convenient so as to effectively save the overlay measurement time. Thus, the area utilization efficiency of the overlay mark is higher than the conventional overlay mark in the present invention.

However, people in the art shall easily realize that the overlay mask in the present invention may not be limited to the aforementioned type or to be formed through the aforementioned steps, and may include other forming process. Thus, the following description will detail the different embodiments of the overlay mask and the forming method thereof of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 4:
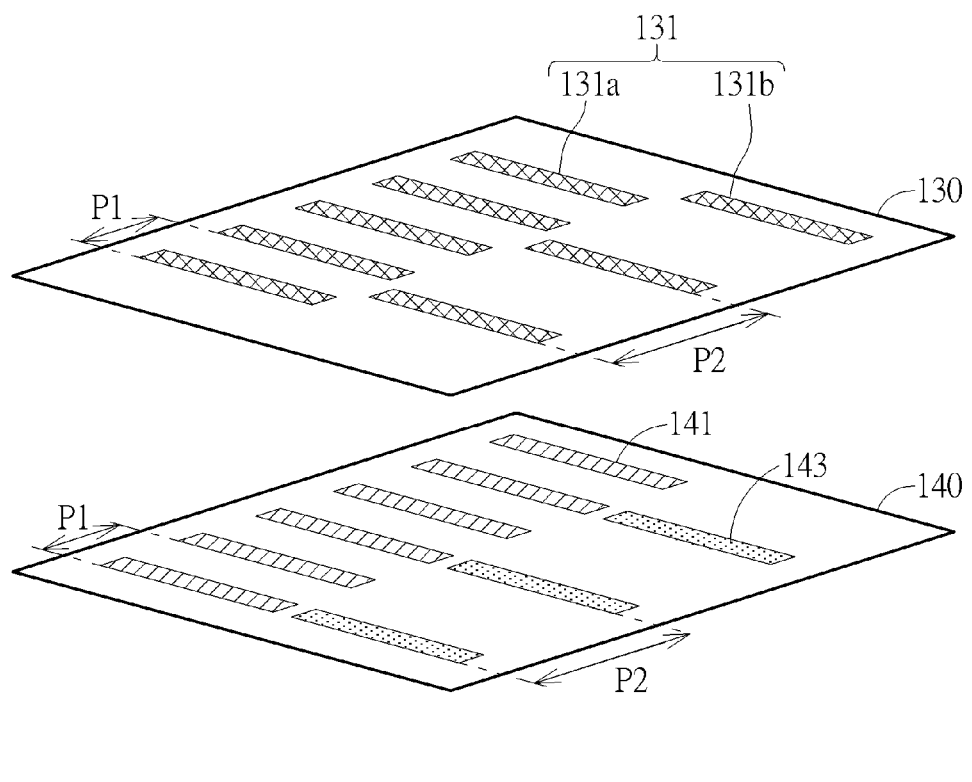
FIG. 4 is a schematic diagram illustrating method of forming an overlay mask according to a second preferred embodiment of the present invention.

Please refer to FIG. 4, which is a schematic diagram illustrating a method of an overlay mask according to the second preferred embodiment of the present invention. The formal steps in the present embodiment are similar to those in the first embodiment, and the differences between the present embodiment and the aforementioned first embodiment are that a plurality of first patterns 141 and second patterns 143 are both defined on the same layer, like a layer 140 for example, as shown in FIG. 4. In other words, the first patterns 141 are arranged within the first pitch P1, on a first part of the layer 140, and the second patterns 143 are arranged within the second pitch P2, on a second part of the layer 140. It is noted that, the first portion of the third patterns 131*a* remain alternately arranged with the first patterns 141 within the first pitch P1, and the second portion of the third patterns 131*b* remain alternately arranged with the second patterns 143 within the second pitch P2, as shown in FIG. 4.

Besides the aforementioned differences, other features are all similar to those in the aforementioned first embodiment, or are well known in the art and will not be redundantly described herein. In this manner, the overlay mask 100 shown in FIG. 2 may also be obtained, however only through two different exposure steps, but is not limited thereto.

Figure 5:
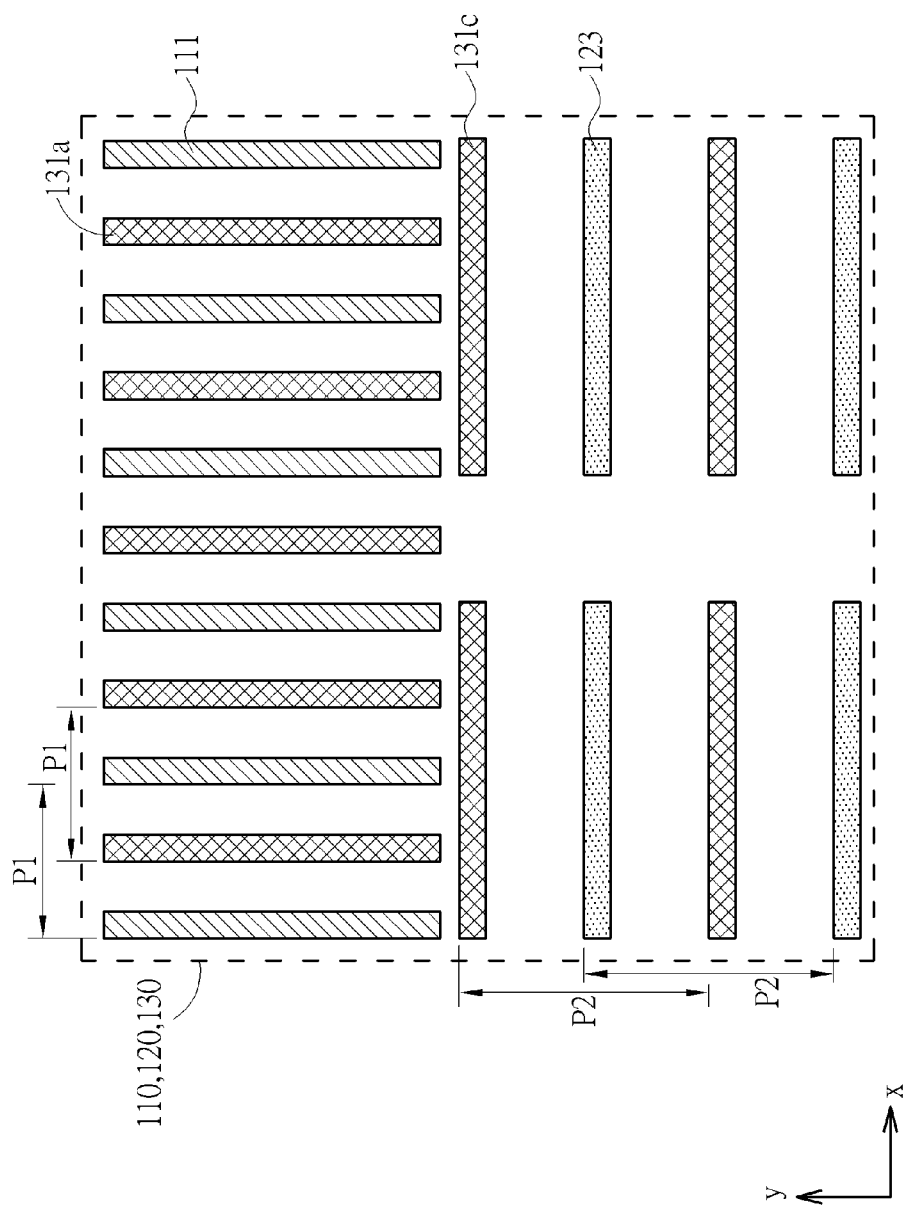
FIG. 5 is a schematic diagram illustrating an overlay mask according to a third preferred embodiment of the present invention.

Please refer to FIG. 5, which is a schematic diagram illustrating an overlay mask according to the third preferred embodiment of the present invention. The formal features of the overlay mask 200 in the present embodiment are similar to those in the first embodiment, and the differences between the present embodiment and the aforementioned first embodiment are that the overlay mask 200 includes the first patterns 111 and the first portion of the third patterns 131*a* arranged alternately within the first pitch P1, along the first direction, for example the y-direction, and a plurality of second patterns 123 and a second portion of the third patterns 131*c* arranged alternately within the second pitch P2, along a second direction, for example a x-direction, as shown in FIG. 5. Please also note that, the first pitch P1 remains not equal to the second pitch P2, for example, being smaller than the second pitch P2, as shown in FIG. 5, but is not limited thereto. In another embodiment, the first pitch may also be greater than the second pitch (not shown in the drawings). Besides the aforementioned differences, the forming steps and other features are all similar to those in the aforementioned first embodiments, or are well known in the art and will not be redundantly described herein.

Figure 6:
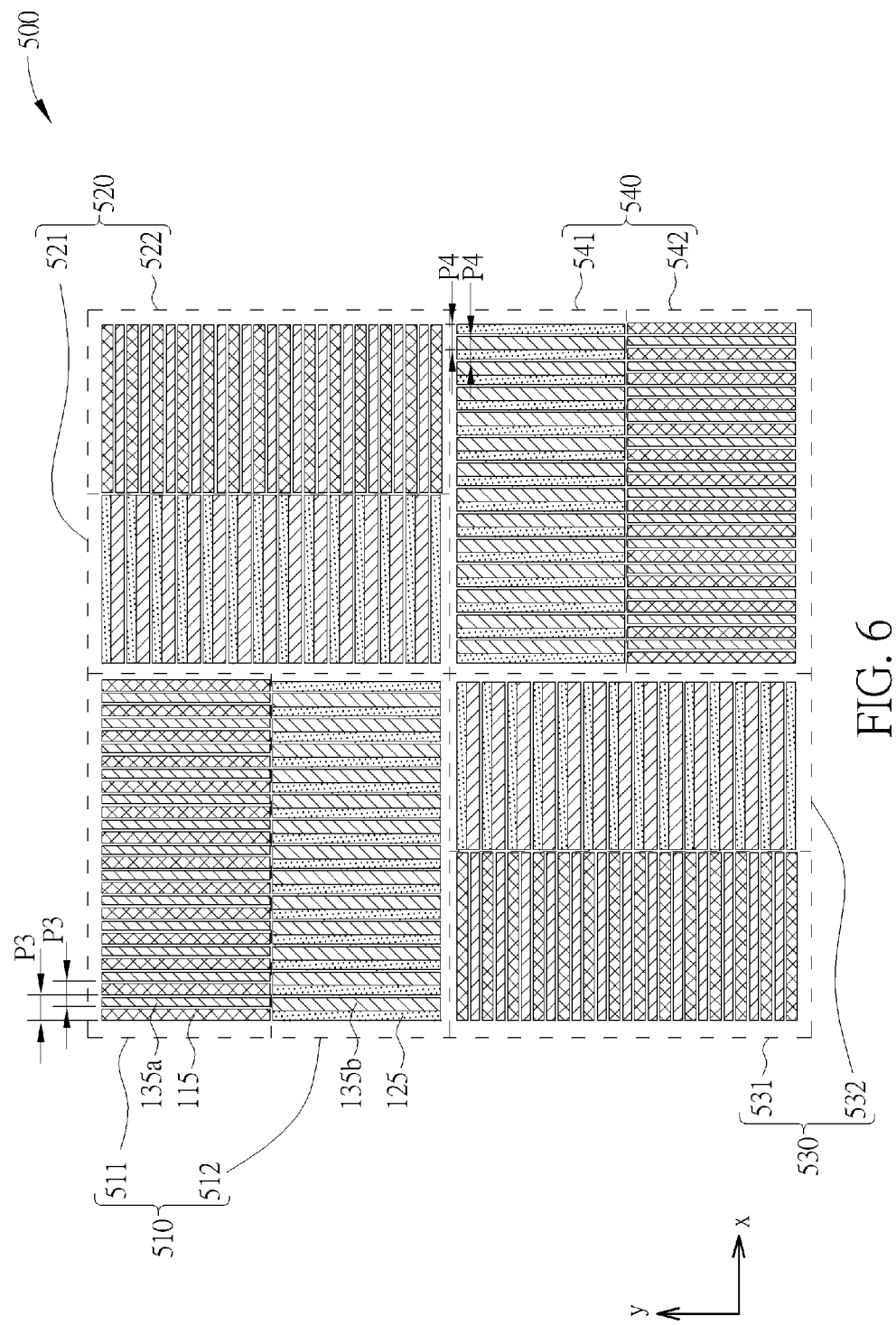
FIG. 6 is a schematic diagram illustrating an overlay mask according to a fourth preferred embodiment of the present invention.

Please refer to FIG. 6, which is a schematic diagram illustrating an overlay mask according to the fourth preferred embodiment of the present invention. The overlay mask 500 includes a first region 510, a second region 520, a third region 530 and a fourth region 540 in an 2×2 array, wherein the first region 510 and the second region 520, and the third region 530 and the fourth region 540 are parallelly arranged with each other, and the third region 530 and the fourth region 540 are diagonally arranged to the first region 510 and the second region 520, respectively, as shown in FIG. 6. It is noted that, the number of the regions in the overlay mask is not limited to what is shown in FIG. 6, and may be further adjusted according to the practical requirement. For example, regions in a 2×3 array or a 3×3 array may also be provided for practical requirement.

Precisely speaking, a portion of a plurality of first patterns 115 is disposed in a first part 511 of the first region 510 and a second part 542 of the fourth region 540, and preferably is arranged parallel to each other in a first direction, such as y-direction, within a first pitch P3, and another portion of the plurality of first patterns 115 is disposed in a second part 522 of the second region 520 and a first part 531 of the third region 530, and preferably is arranged parallel to each other in a second direction being perpendicular to the first direction, such as x-direction, within the first pitch P3. Also, a portion of a plurality of second patterns 125 is disposed in a second part 512 of the first region 510 and a first part 541 of the fourth region 540, and preferably is arranged parallel to each other in the first direction, such as they-direction, within a second pitch P4, and another portion of the plurality of second patterns 125 is disposed in a first part 521 of the second region 520 and a second part 532 of the third region 530, and preferably is arranged parallel to each other in the second direction, such as the x-direction, within the second pitch P4.

It is worth noting that, a portion of a plurality of third patterns 135a is arranged alternately with the first patterns 115 in the first part 511 of the first region 510, the second part 522 of the second region 520, the first part 531 of the third region 530, and the second part 542 of the fourth region 540, also in the first pitch P3; and another portion of the third patterns 135b are arranged alternately with the second patterns 125 in the second part 512 of the first region 510, the first part 521 of the second region 520, the second part 532 of the third region 530, and the first part 541 of the fourth region 540, also in the second pitch P4. Please note that, the first pitch P3 is not equal to the second pitch P4, for example, being smaller than the second pitch P4, as shown in FIG. 6, but is not limited thereto. In another embodiment, the first pitch may also be greater than the second pitch (not shown in the drawings).

Besides the aforementioned arranging features, the forming steps and others are all similar to those in the aforementioned first or second embodiments, or are well known in the art. For example, in one embodiment the first patterns 115, the second patterns 125 and the third patterns 135a, 135b in the four regions 510, 520, 530, 540 may be defined on different layers through three different exposure steps respectively, but is not limited thereto. In another embodiment, the first patterns 115 and the second patterns 125 may be defined on the same layer or through the same exposure step.

Through the aforementioned embodiment, the overlay mask in more diverse arrangement is obtained. In the present embodiment, the linear patterns may be disposed in different parts of different regions in the x-direction or the y-direction, so that, the arrangement of the overlay mask may be more diverse. In this way, the overlay measurement may be more convenient, so as to save the overlay measurement time and to improve the area utilization efficiency of the overlay mark.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An overlay mask comprising:
   a plurality of first patterns arranged within a first pitch;
   a plurality of second patterns arranged within a second pitch; and
   a plurality of third patterns, wherein a first portion of the third patterns are arranged alternately with the first patterns, within the first pitch, a second portion of the third patterns are arranged alternately with the second patterns, within the second pitch, and the first pitch is not equal to the second pitch.

2. The overlay mask according to claim 1, wherein the first pitch is greater than the second pitch.

3. The overlay mask according to claim 1, wherein the first pitch is smaller than the second pitch.

4. The overlay mask according to claim 1, wherein the first patterns and the third patterns are respectively defined in different exposure steps.

5. The overlay mask according to claim 1, wherein the second patterns and the third patterns are respectively defined in different exposure steps.

6. The overlay mask according to claim 1, wherein the first patterns, the second patterns and the third patterns are respectively defined by different exposure steps.

7. The overlay mask according to claim 1, wherein the first patterns and the second patterns are formed on a same layer.

8. The overlay mask according to claim 1, wherein the first patterns are defined on a first layer, the second patterns are defined on a second layer and the third patterns are defined on a third layer, and the first layer, the second layer and the third layer are arranged vertically sequentially.

9. The overlay mask according to claim 1, wherein the third patterns comprise a photoresist layer.

10. The overlay mask according to claim 1, wherein the first portion of the third patterns and the first patterns are arranged alternately in a first direction, and the second portion of the third patterns and the second patterns are arranged alternately in a second direction.

11. The overlay mask according to claim 1, wherein the first portion of the third patterns and the first patterns are arranged alternately in a first direction, and the second portion of the third patterns and the second patterns are arranged alternately in the first direction.

* * * * *